(12) United States Patent
Inoue

(10) Patent No.: US 6,207,509 B1
(45) Date of Patent: Mar. 27, 2001

(54) METHOD OF MANUFACTURING A SEMICONDUCTOR DEVICE

(75) Inventor: Tatsuro Inoue, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/357,298

(22) Filed: Jul. 20, 1999

(30) Foreign Application Priority Data

Jul. 21, 1998 (JP) ................................................. 10-204841

(51) Int. Cl.[7] .................................................. H01L 21/8234
(52) U.S. Cl. ............................ 438/275; 428/257; 428/263
(58) Field of Search .................................. 438/275, 263, 438/264, 257, 258, 261, 298, 541, 542

(56) References Cited

U.S. PATENT DOCUMENTS

| 5,254,489 | * | 10/1993 | Nakata | 438/241 |
| 5,466,622 | * | 11/1995 | Cappelleti | 438/287 |
| 5,553,017 | * | 9/1996 | Ghezzi et al. | 257/314 |
| 5,668,035 | * | 9/1997 | Fang et al. | 438/239 |

* cited by examiner

Primary Examiner—David Nelms
Assistant Examiner—Dung Anh Le
(74) Attorney, Agent, or Firm—Young & Thompson

(57) ABSTRACT

In a method of manufacturing a semiconductor device, a first sacrifice oxide film is formed on a substrate. Next, a second sacrifice oxide film is formed on the substrate by etching the first sacrifice oxide film to a predetermined depth in a first etching process. Herein, the second sacrifice oxide film is thinner than the first sacrifice oxide film. Subsequently, the second sacrifice oxide film is completely removed from a surface of the substrate in a second etching process so as to expose the surface of the substrate. Finally, an oxide film is formed on the exposed surface of the substrate.

15 Claims, 7 Drawing Sheets

METHOD OF MANUFACTURING A SEMICONDUCTOR DEVICE

BACKGROUND OF THE INVENTION

1. Field of the Invention

This invention relates a method of manufacturing a semiconductor device or a semiconductor memory device, and in particular, to a method of manufacturing a semiconductor device having various kinds of gate insulating films.

2. Description of the Related Art

For example, a semiconductor device, such as, a DRAM (Dynamic Random Access Memory) or a SRAM (Static Random Access Memory) is generally composed of a plurality of insulating gate field effect transistors (thereinafter, referred to as a MOS transistor).

With low power consumption and low operation voltage, various kinds of gate insulating films are used for the MOS transistor constituting such a semiconductor device.

For example, a silicon oxide film as the gate insulating film is thinly formed in a thickness in the MOS transistor constituting an internal circuit of the semiconductor device. In contrast, the silicon oxide film as the gate insulating film is thickly in a thickness in the MOS transistor constituting an external circuit of the semiconductor device. Thus, the various kinds of gate insulating films are used for the respective MOS transistors in a memory semiconductor device.

In the meanwhile, a floating gate type MOS transistor is used in addition to a normal type MOS transistor in a flash memory semiconductor device of an EEPROM (Electrically Erasable Programmable ROM) type. In this event, a gate insulating film of the normal type MOS transistor is formed different from a tunnel oxide film of the floating gate MOS transistor in the kind.

Referring to FIG. 1, description will be made about the floating type MOS transistor.

Specifically, field oxide films 102 are selectively formed for desired regions on a surface of a silicon substrate 101 by the use of the known thermal oxidation process, as illustrated in FIG. 1. In this case, a gate oxide film 103 serves as the gate insulating film in the MOS transistor on a peripheral region of the flash memory semiconductor device. Herein, the gate oxide film 103 is formed on the surface of the silicon substrate 101 in an active region surrounded by the field oxide films 102.

Further, a gate electrode 104 is formed on the gate oxide film 103. Herein, it is to be noted that the gate oxide film 103 may be a silicon oxide film which is formed by the use of the thermal oxidation process.

Moreover, the floating gate MOS transistor in a memory cell region, which is the internal region of the flash memory semiconductor device, has a tunnel oxide film 105. Herein, the tunnel oxide film 105 is formed on the surface of the silicon substrate 101 in the active region surrounded by the field oxide films 102 in the same manner.

Further, a floating gate electrode 106 is formed on the tunnel oxide film 105. An intermediate insulating film 107 is deposited on a surface of the floating gate electrode 106. In addition, a control gate electrode 108 is formed on the intermediate insulating film 107. Herein, it is to be noted that the tunnel oxide film 105 may be a silicon oxide film which is a thin film formed by the thermal oxidation process.

Subsequently, description will be made about a method of forming the above-mentioned tunnel oxide film 105 and the gate oxide film 103 with reference to FIGS. 2A through 2C.

The field oxide films 102 are formed on the surface of the silicon substrate 101 which has a conductive type of a P-type by the use of the known LOCOS Local Oxidation of Silicon) method, as illustrated in FIG. 2A. Further, the surface of the silicon substrate 101, which is the active region, is thermally oxidized to form a sacrifice oxide film 109.

Next, a resist mask 110, which covers the peripheral region and has an opening portion in the memory cell region, is formed by the use of the known photolithography technique, as illustrated in FIG. 2B. Further, the sacrifice oxide film 109 in the memory cell region is completely removed by using the resist mask 110 as an etching mask.

Herein, it is to be noted that chemical liquid, such as, buffered hydrofluoric acid is used in the above-mentioned etching process. Consequently, the surface of the silicon substrate 111 is exposed, as shown in FIG. 2B. In this case, the sacrifice oxide film 109a is left in the peripheral region.

Subsequently, the resist mask 110 is removed by the use of organic solvent. Further, the surface of the silicon substrate 101 is cleaned in a washing process. In consequence, the tunnel oxide film 105 is deposited on the surface 111 of the silicon substrate 101, as illustrated in FIG. 2C. In such a thermal oxidation step, a region, in which the sacrifice oxide film 109a is left, is not almost oxidized.

Thereinafter, referring to FIG. 1 together, after the floating gate electrode 106 and the intermediate insulating film 107 are formed, the above-mentioned sacrifice oxide film 109a is removed. Further, the gate oxide film 103 is deposited by the use of the thermal oxidation process. Herein, it is to be noted that the intermediate insulating film 107 is formed by a silicon nitride film and the like.

Thus, the tunnel oxide film 105 of the floating gate MOS transistor and the gate oxide film 103 of the normal type MOS transistor are formed, respectively, as illustrated in FIG. 1.

However, uniformity of a film thickness of the formed tunnel oxide film 105 is degraded in the above-described related technique. This is because large irregularities are readily generated on the exposed surface 111 of the silicon substrate 101 in the etching step by the use of the chemical liquid described with respect to FIG. 2B. Namely, micro-roughness on the surface of the silicon substrate 101 becomes large in this case.

Further, etching rate of the sacrifice oxide film 109 by the chemical liquid is set so as to become high to achieve mass production in the related technique. Consequently, variation or fluctuation of the etching process becomes large in a semiconductor wafer as the silicon substrate 101.

Moreover, variation of the etching process also becomes large at an edge portion 112 of the field oxide film 102 illustrated in FIG. 2C. This is because withdrawal or recession of the etched field oxide film 102 is different in dependency upon wafer positions. In consequence, areas of the active region are largely varied. Thereby, areas, in which the tunnel oxide film 105 is deposited, are also varied on the wafer.

The above-mentioned variation with respect to the thickness of the tunnel oxide film and variation with respect to the area of the tunnel oxide film cause characteristic variation of the flash memory semiconductor device. In particular, variation with respect to erasing characteristic of the flash memory inevitably occurs.

In consequence, manufacturing yield of the semiconductor device, such as, the flash memory semiconductor device is lowered. Further, manufacturing cost of such a semiconductor device is increased.

SUMMARY OF THE INVENTION

It is therefore an object of this invention to provide a method of manufacturing a semiconductor device which is capable of reducing or eliminating micro-roughness.

It is another object of this invention to provide a method of manufacturing a semiconductor device which is capable of readily forming various kinds of gate insulating films.

According to this invention, a first sacrifice oxide film is formed on a substrate.

Next, a second sacrifice oxide film is formed on the substrate by etching the first sacrifice oxide film to a predetermined depth in a first etching process. Herein, the second sacrifice oxide film is thinner than the first sacrifice oxide film.

Subsequently, the second sacrifice oxide film is completely removed from a surface of the substrate in a second etching process so as to expose the surface of the substrate.

Finally, an oxide film is formed on the exposed surface of the substrate.

In this case, the first etching process is carried out at a first etching rate while the second etching process is carried out at a second etching rate. Herein, the second etching rate is lower than the first etching rate.

Further, the first etching process is performed by the use of a first chemical liquid while the second etching process is performed by the use of a second chemical liquid. Herein, the first chemical liquid has the first etching rate while the second chemical liquid has the second etching rate.

For example, the second chemical liquid comprises dilute hydrofluoric acid etching solution containing detergent.

In this event, the removal of the second sacrifice oxide film is carried out in order to reduce micro-roughness on the surface of the substrate.

In consequence, the micro-roughness of the substrate surface, which is exposed by removing the second sacrifice oxide film, becomes excessively small. Further, reliability of the oxide film is extremely enhanced.

Moreover, when the second sacrifice oxide film is completely removed in the second etching process, the over-etching quantity for removing the second sacrifice oxide film by the etching becomes small because the etching rate is small.

Further, variation or fluctuation with respect to the etching of the edge portion of the field oxide film also becomes small, and variation of the surface of the silicon substrate is excessively reduced.

Further, the variation of the thickness of the tunnel oxide film and the variation of the area of the region for forming the tunnel oxide film are reduced in the flash memory semiconductor device.

In particular, the variation of the erasing characteristic of the flash memory is largely reduced. Thus, the manufacturing cost of the flash memory semiconductor device is reduced.

In addition, various kinds of gate insulating films having high reliability can be readily formed in the MOS transistor in the case of the semiconductor device, such as, the SRAM and the DRAM. This is excessively effective for forming the thin-film gate insulating film.

DESCRIPTION OF THE PREFERRED EMBODIMENTS (First embodiment)

Figure 3:
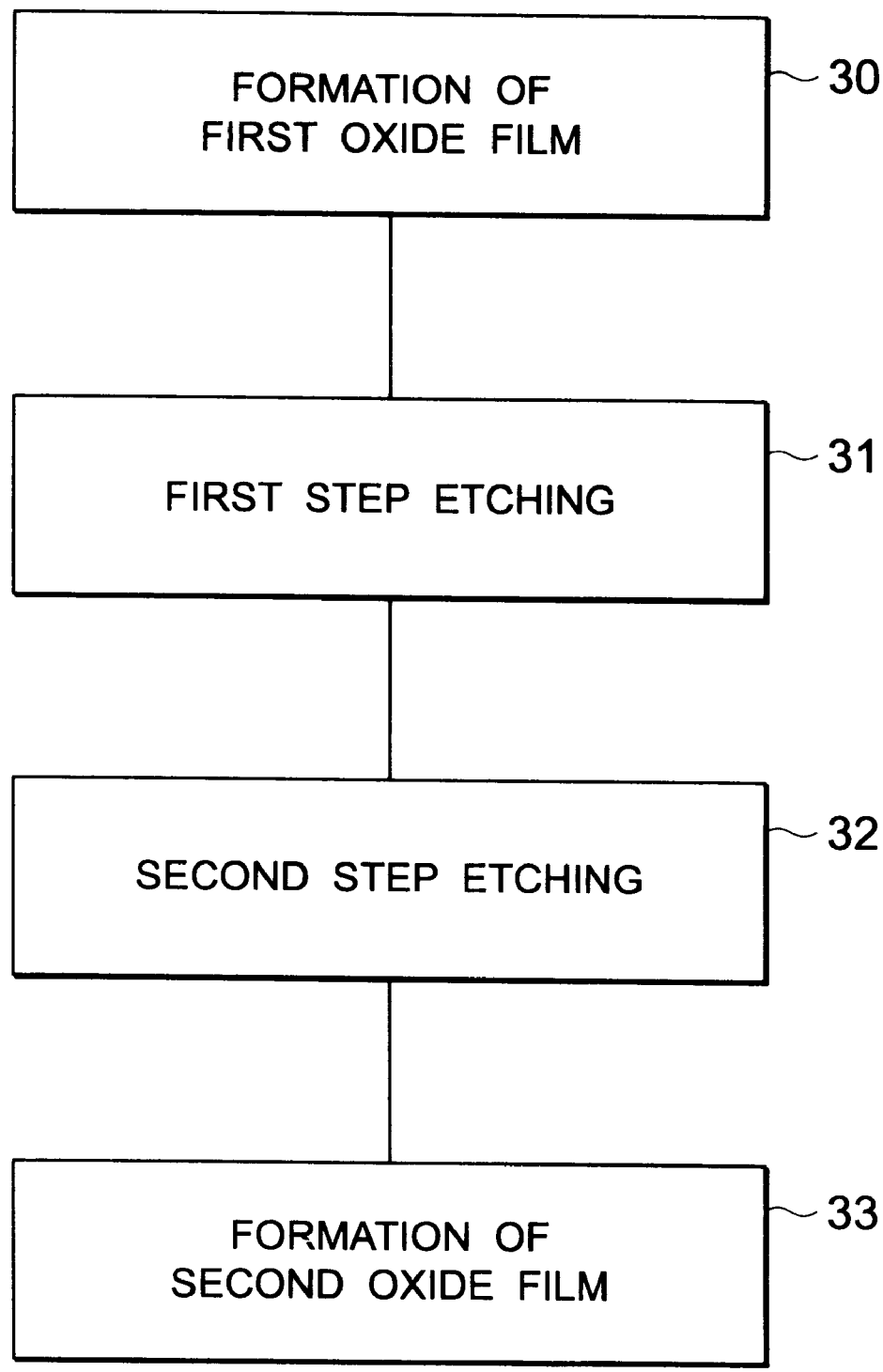
FIG. 3 is a partial flow diagram showing a method of manufacturing a semiconductor device according to this invention.

Referring to FIGS. 3 through 5, description will first be made about a first embodiment of this invention.

A first oxide film is deposited on a silicon substrate in a step 30 in FIG. 3. In this event, the first oxide film may be a silicon oxide film, such as, a sacrifice oxide film which is formed in an active region on the surface of the silicon substrate.

Subsequently, a first etching is carried out in the first step etching process in a step 31, and the first oxide film on the surface of the silicon substrate is etched.

In the first step etching process, the etching of the first oxide film is stopped or halted in the course, and the remained film of the first oxide film is formed on the surface of the silicon substrate. Specifically, the first oxide film is etched to the predetermined depth. For example, the first etching is performed so that the remained film of the first oxide film becomes about 5 nm.

In this case, buffered hydrofluoric acid etching liquid is used as chemical liquid which is used in the first step etching process. Herein, hydrofluoric acid solution of conk of 49% and buffered hydrofluoric acid solution are mixed with 1:30 in volume in the buffered hydrofluoric acid etching liquid.

Next, a second step etching process is carried out in a step 32, and the first oxide film, which is left on the surface of the above-mentioned silicon substrate, is etched. For example, the first oxide film having the remained film of about 4 nm is completely removed in the second step etching process.

In this event, dilute hydrofluoric acid etching liquid is used as chemical liquid which is used in the second step etching process. Herein, dilute hydrofluoric acid, in which hydrofluoric acid solution of conk of 49% and pure water are contained with 1:100 in volume, is mixed with detergent in the dilute hydrofluoric acid etching liquid.

In this case, etching rate of the silicon oxide film of the chemical liquid, which is used in the second step etching process, is lower than etching rate of the silicon oxide film of the chemical liquid which is used in the first step etching process.

For example, the etching rate of the chemical liquid, which is used in the first step etching process, may be 20 nm/min while the etching rate of the chemical liquid, which is used in the second etching, may be 3 nm/min.

Thereby, the micro-roughness, which is formed on the surface of the silicon substrate exposed when the remained first oxide film is completely removed, becomes excessively small. For example, irregularities on the silicon surface as the micro-roughness becomes about 0.5 nm when the first oxide film is completely removed in the first step etching process.

In contrast, the irregularities of the micro-roughness becomes 0.2 nm or less when the first oxide film is completely removed in the second step etching process.

Further, the etching rate becomes small when the first oxide film is completely removed in the second step etching process. Consequently, the first oxide film can be controlled so that over-etching quantity for removing the first oxide film by etching becomes small.

Moreover, the variation or fluctuation of the etched edge portion of the field oxide film described in the related technique becomes small, and the variation of the active region area on the surface of the silicon substrate becomes extremely small.

The above-mentioned exposed silicon substrate surface is thermally oxidized, and the second oxide film is formed in a step 33. For example, the tunnel oxide film is deposited as the second oxide film. In this invention, the tunnel oxide film having high reliability is formed in the above-mentioned manner.

Subsequently, description will be made about formation of the tunnel oxide film and the gate oxide film of the flash memory semiconductor device illustrated in FIG. 1 with reference to FIGS. 4 and 5.

Figure 4A:
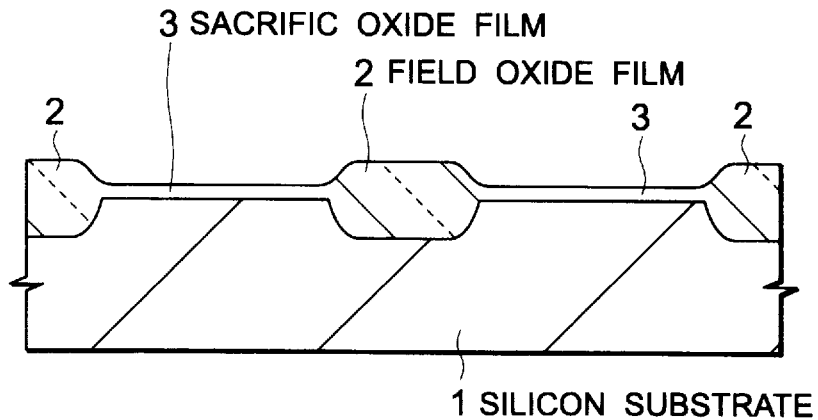
FIGS. 4A through 4C are cross sectional views showing a method of manufacturing a semiconductor device according to a first embodiment of this invention.
Figure 4B:
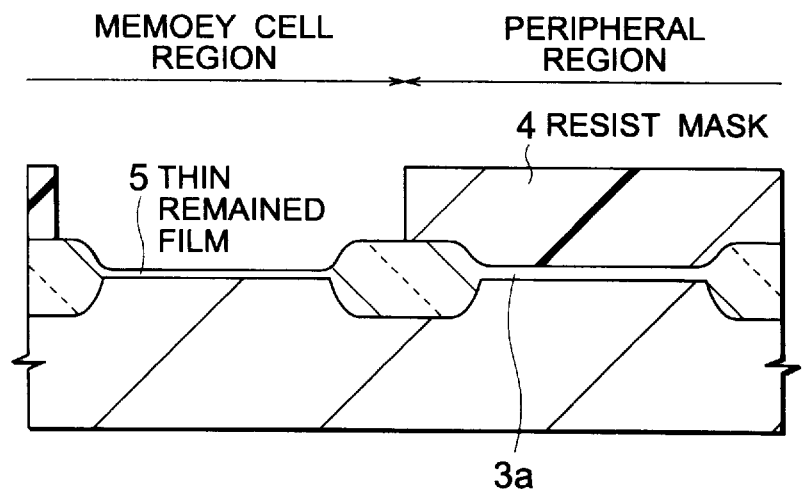

Field oxide films 2 are formed on a surface of a silicon substrate 1 in the same manner as the related technique, as illustrated in FIG. 4A. Further, the surface of the silicon substrate 1 as an active region is thermally oxidized to form a sacrifice oxide film 3.

Subsequently, a resist mask 4, which covers a peripheral region and has an opening portion in a memory cell region, is formed by the use of the known photolithography technique. Further, the sacrifice oxide film 3 in the memory cell region is etched in the course by using the resist mask 4 as an etching mask. Namely, the first step etching process is carried out. Thus, a thin remained film 5 having a film thickness of about 2 nm is formed. In this event, chemical liquid, such as, the buffered hydrofluoric acid etching liquid is used to perform the above-mentioned etching process as explained in FIG. 3. Thereby, the sacrifice oxide film 3a, which is not etched, is left in the peripheral region.

Figure 4C:
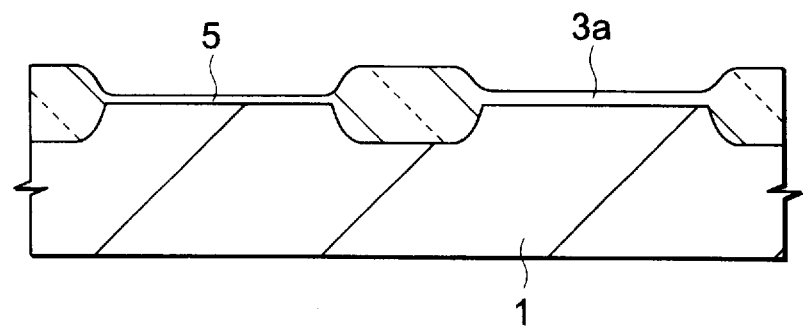

Next, the resist mask 4 is removed by the use of organic solvent. Further, the surface of the silicon substrate 1, which is in a state illustrated in FIG. 4C, is cleaned in a washing step. In the washing step, mixed solution of sulfuric acid, excess oxidation hydrogen and pure water or mixed solution of hydrochloric acid, excess oxidation hydrogen and pure water is used.

In such a washing step using the mixed solution, heavy metal on the surfaces of the sacrifice oxide film 3a and the thin remained film 5 on the surface of the silicon substrate 1 is completely removed, as shown in FIG. 4C. Herein, it is to be noted that the heavy metal is mainly generated from the resist mask 4 illustrated in FIG. 4B.

Figure 5A:
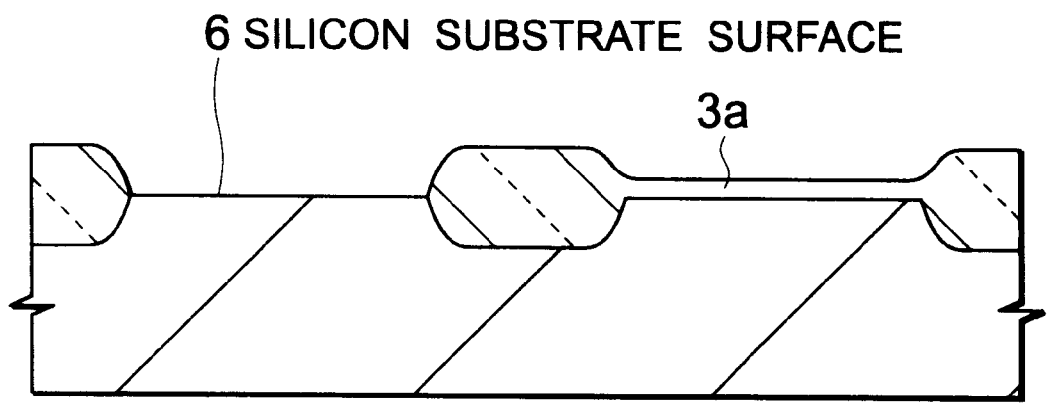
FIGS. 5A and 5B are cross sectional views showing a method of manufacturing a semiconductor device according to a first embodiment of this invention.

Subsequently, the thin remained film 5 on the surface of the silicon substrate 1 illustrated in FIG. 4C is completely removed by the second step etching process explained in FIG. 3. Thus, the surface 6 of the silicon substrate 1 is exposed, as shown in FIG. 5A.

In this case, the chemical liquid, such as, the dilute hydrofluoric acid etching liquid explained in FIG. 3 is used for this etching process. Herein, it is to be noted that etching duration is preferably set to 40 seconds. The thin remained film 5 is completely removed by this etching process. In this event, etching quantity of the surface of the sacrifice oxide film 3a illustrated in FIG. 5A may be about 3 nm.

Figure 5B:
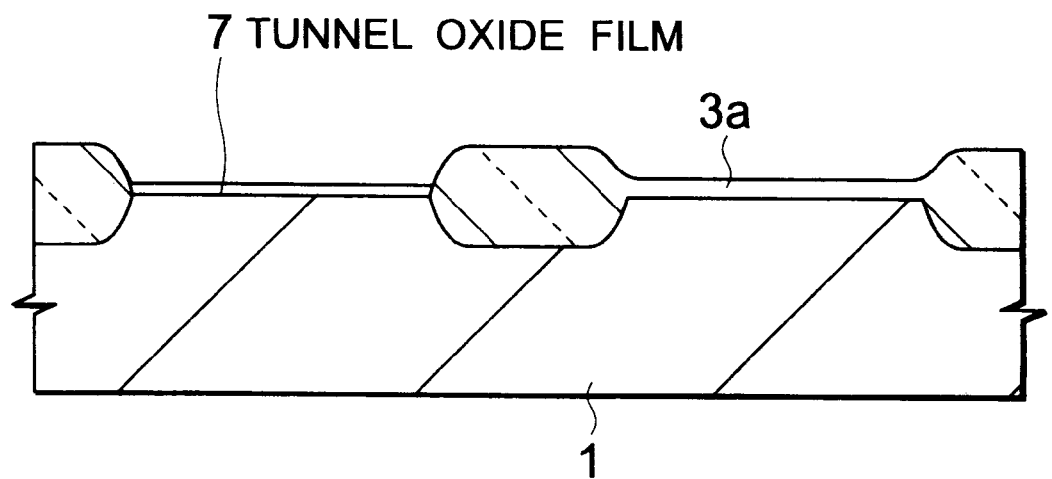

Next, the tunnel oxide film 7 is deposited to a film thickness of about 10 nm by the use of the thermal oxidation process, as illustrated in FIG. 5B.

Figure 1:
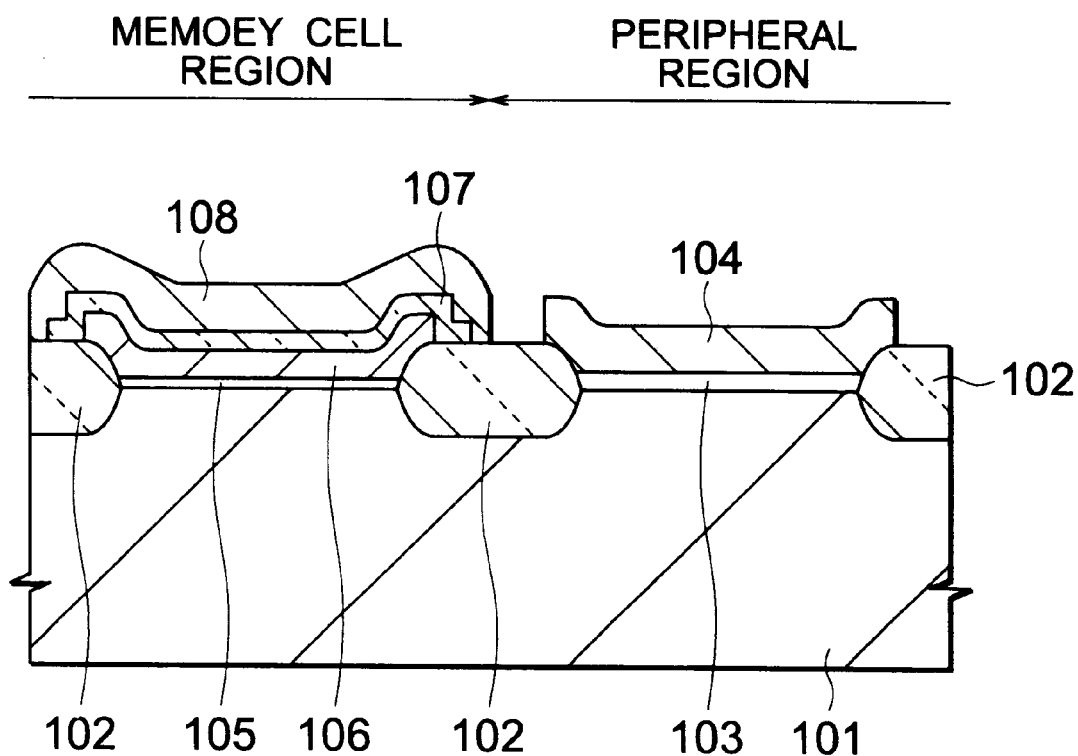
FIG. 1 is a cross sectional view showing a related semiconductor device.
Figure 2A:
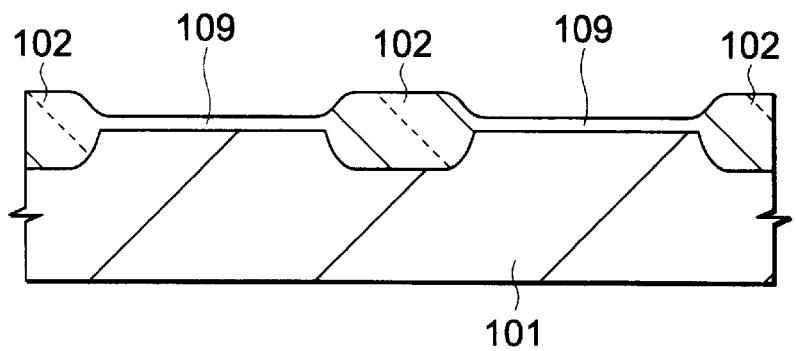
FIGS. 2A through 2C are cross sectional views showing a method of manufacturing a related semiconductor device.
Figure 2B:
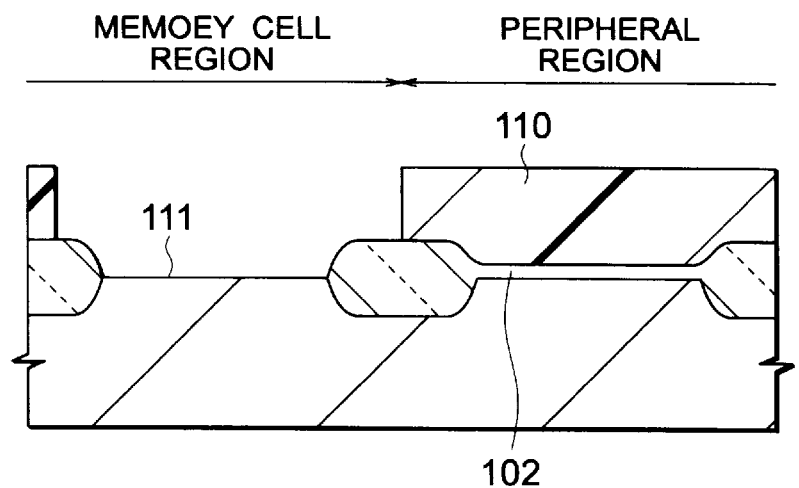
Figure 2C:
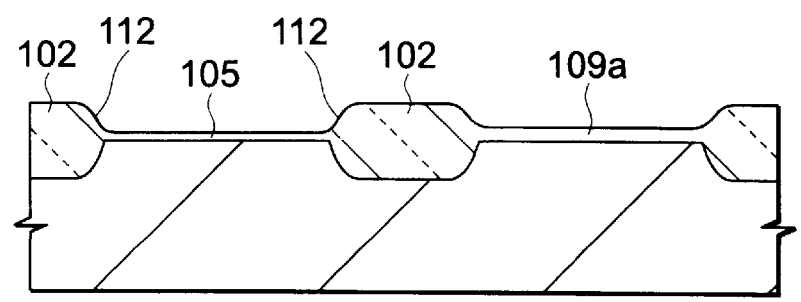

Thereinafter, referring together with FIG. 1, after the floating gate electrode 106 and the intermediate insulating film 107 are formed, the above-mentioned sacrifice oxide film 3a is removed. Further, the thermal oxidation process is again carried out to form the gate oxide film 103.

Herein, it is to be noted that the intermediate insulating film 107 may be structured by the silicon nitride film and the like. Thus, the tunnel oxide film 105 of the floating gate MOS transistor and the gate oxide film 103 of the normal type MOS transistor are formed, respectively, as illustrated in FIG. 1.

(Second embodiment)

Subsequently, description will be made about a second embodiment of this invention with reference to FIGS. 6 and 7. Herein, it is to be noted that the same components explained in the first embodiment are represented by the same reference numerals.

Figure 6A:
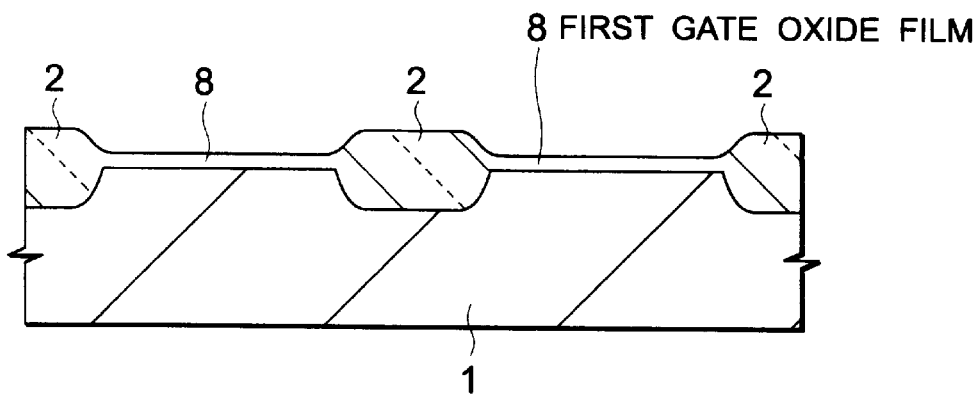
FIGS. 6A through 6C are cross sectional views showing a method of manufacturing a semiconductor device according to a second embodiment of this invention.
Figure 7A:
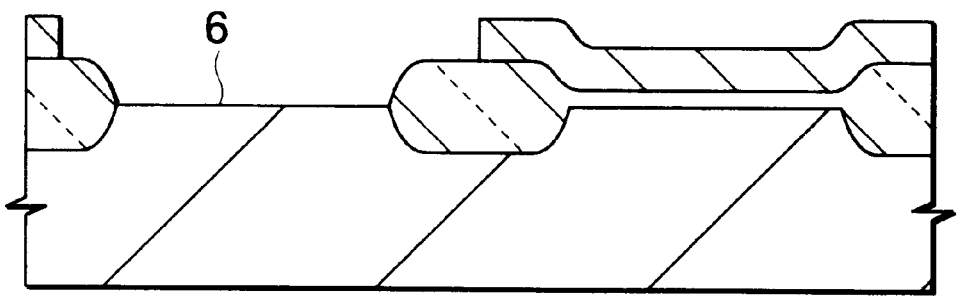
FIGS. 7A through 7C are cross sectional views showing a method of manufacturing a semiconductor device according to a second embodiment of this invention.

As shown in FIG. 6A, field oxide films 2 are selectively formed on a surface of a silicon substrate 1. Further, the surface of the silicon substrate 1 as an active region is thermally oxidized, and a first gate oxide film 8 is formed to a film thickness of about 15 nm.

Subsequently, a first gate electrode 9 and a resist mask 4, which cover an external region of the semiconductor device and have an opening portion in an internal region, is formed the known photolithography technique and dry-etching technique. In this event, the first gate electrode 9 is preferably a polysilicon film containing phosphorus impurity.

Figure 6B:
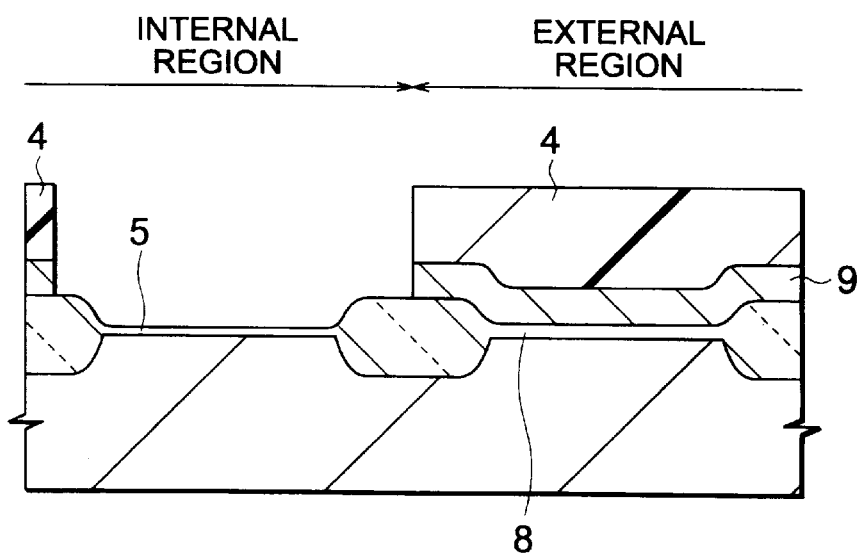

Thereafter, the first gate oxide film 8 in the internal region is etched in the course by using the resist mask 4 as an etching mask. That is, the first step etching process explained in FIG. 3 is carried out. Thus, a thin remained film 5 having the film thickness of about 4 nm is formed, as illustrated in FIG. 6B.

In this case, chemical liquid, such as, buffered hydrofluoric acid etching liquid is also used for the above-mentioned etching process.

Figure 6C:
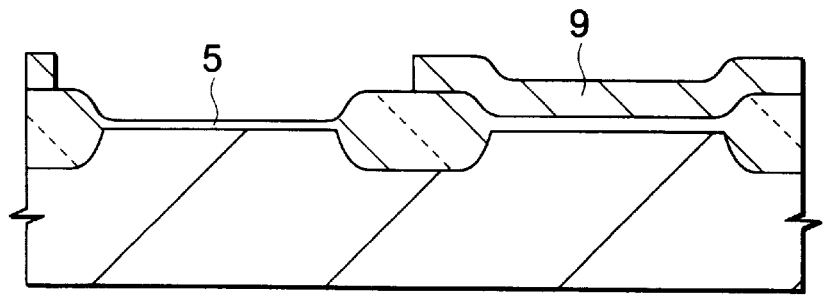

Next, the resist mask 4 is removed, as illustrated in FIG. 6C. Further, the surface of the thin remained film 5 and the surface of the first gate electrode 9 are cleaned in a washing step.

In the washing step, mixed solution of hydrochloric acid, excess oxidation hydrogen and pure water is used.

Subsequently, the thin remained film 5 on the surface of the silicon substrate 1 illustrated in FIG. 6C is completely removed by the use of the chemical liquid, such as, the dilute hydrofluoric acid etching liquid explained in FIG. 3.

Herein, the etching duration is preferably set to about 70 seconds. In this etching process, the thin remained film 5 is completely removed on the wafer. Thus, a silicon substrate surface 6 is exposed, as illustrate in FIG. 7A.

Figure 7B:
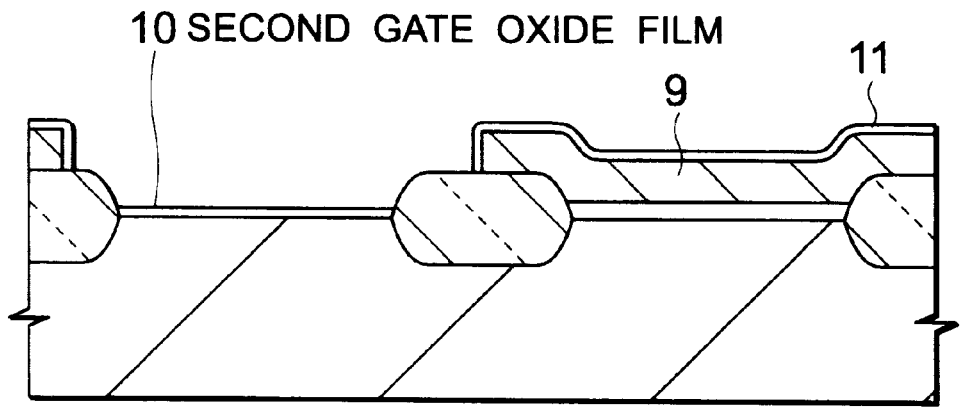

Next, a second gate oxide film 10 is deposited on the silicon substrate surface 6 by the use of the thermal oxidation process, as illustrated in FIG. 7B. Herein, the film thickness of the second gate oxide film 10 is preferably set to about 6 nm.

In the step of the thermal oxidation, the silicon oxide film is deposited on the surface of the first gate electrode 9 to form a protection insulating film 11.

After the second gate oxide film 10 and the protection insulating film 11 are coated, and a polycide film, such as, tungsten is deposited. Further, the polycide film is patterned by the use of the photolithography technique and the dry-etching technique, and a second gate electrode 12 is formed on the gate oxide film 10, as illustrated in FIG. 7C.

Figure 7C:
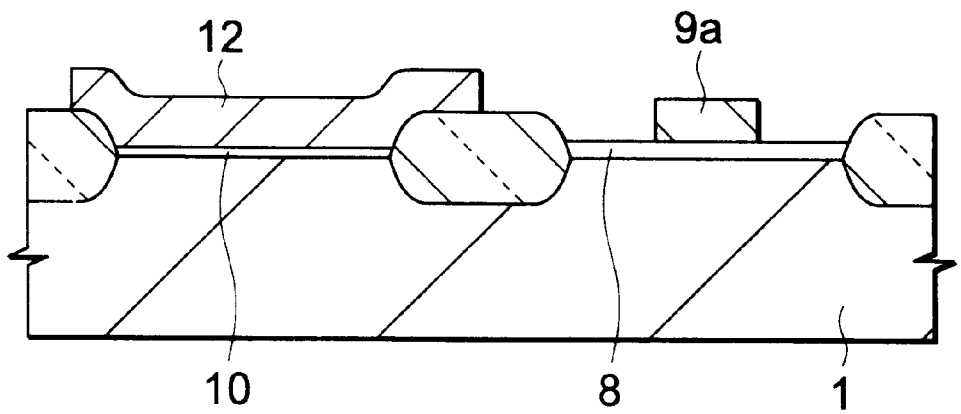

Moreover, the first gate electrode 9 is patterned in the same manner, and a first gate electrode 9a is formed, as illustrated in FIG. 7C.

In consequence, the first gate oxide film 8 having the thick film thickness is formed in the external region on the silicon substrate 1 while the second gate oxide film 10 having the thin film thickness is formed in the internal region. Thus, the MOS transistor, which has two kinds of gate insulating films, is formed in the semiconductor device.

Thereby, the micro-roughness is lowered like the first embodiment, and the reliability of the second gate oxide film (namely, the thin gate insulating film) is largely enhanced.

In the above-mentioned embodiments, the two kinds of gate insulating films are formed in the semiconductor device, such as, the flash memory semiconductor device and the DRAM.

However, this invention is not limited to such a semiconductor device, and can be applied for the other semiconductor devices each of which has various kinds of gate insulating films as an effective method.

What is claimed is:

1. A method of manufacturing a semiconductor device having a substrate, comprising the steps of:

forming a first sacrifice oxide film on said substrate;

forming a second sacrifice oxide film on said substrate by etching said first sacrifice oxide film to a predetermined depth in a first etching process, said second sacrifice oxide film being thinner than said first sacrifice oxide film;

completely removing said second sacrifice oxide film from a surface of said substrate in a second etching process so as to expose the surface of said substrate; and forming an oxide film on the exposed surface of said substrate.

2. A method as claimed in claim 1, wherein:

the first etching process is carried out at a first etching rate while the second etching process is carried out at a second etching rate, the second etching rate being lower than the first etching rate.

3. A method as claimed in claim 2, wherein:

the first etching process is performed by the use of a first chemical liquid while the second etching process is performed by the use of a second chemical liquid, the first chemical liquid having the first etching rate while the second chemical liquid having the second etching rate.

4. A method as claimed in claim 3, wherein:

the second chemical liquid comprises dilute hydrofluoric acid etching solution containing detergent.

5. A method as claimed in claim 1, wherein:

the removal of said second sacrifice oxide film is carried out in order to reduce micro-roughness on the surface of said substrate.

6. A method as claimed in claim 1, wherein:

said oxide film comprises a tunnel oxide film which is formed by the use of a thermal oxidation process.

7. A method of manufacturing a semiconductor memory device which has a memory cell region and a peripheral region adjacent to said memory cell region on a substrate, comprising the steps of:

forming sacrifice oxide films on said memory cell region and said peripheral region, respectively;

forming a resist mask on the sacrifice oxide film on the peripheral region;

etching the sacrifice oxide film on said memory cell region to a predetermined depth by the use of said resist mask so as to remain a thin film on said active region;

removing the resist mask on the peripheral region in order to remain the sacrifice oxide film on the peripheral region;

completely removing the thin film on the memory cell region so as to expose a surface of the substrate; and forming a tunnel oxide film on the exposed surface of the substrate.

8. A method as claimed in claim 7, further comprising the following steps of:

removing the sacrifice oxide film on the peripheral region; and forming a gate oxide film on said peripheral region by the use of a thermal oxidation process.

9. A method as claimed in claim 7, wherein:

said memory cell region is separated from said peripheral region by a field oxide film which is formed on the substrate.

10. A method as claimed in claim 7, wherein:

said semiconductor device comprises a flash memory.

11. A method of manufacturing a semiconductor memory device which has an internal region and an external region adjacent to said internal region on a substrate, comprising the steps of:

forming first oxide films on said internal region and said external region, respectively;

forming a first gate electrode and a resist mask on the first oxide film on said external region;

etching the first oxide film on said internal region to a predetermined depth by the use of said resist mask so as to remain a thin film on said internal region;

removing the resist mask on said external region;

completely removing the thin film on the internal region in order to expose a surface of the substrate;

forming a second gate oxide film on the exposed surface of the substrate on the internal region; and forming a second gate electrode on said second gate oxide film.

12. A method as claimed in claim 11, wherein:

the first gate oxide film is thicker than the second gate oxide film.

13. A method as claimed in claim 11, wherein:

said semiconductor device comprises a flash memory or a DRAM.

14. A method as claimed in claim 11, wherein:

said internal region is separated from said external region by a field oxide film which is formed on the substrate.

15. A method as claimed in claim 11, wherein:

said first gate electrode comprises a polysilicon film.

* * * * *